United States Patent
Obikane

(10) Patent No.: US 8,267,633 B2
(45) Date of Patent: Sep. 18, 2012

(54) FOUP OPENING/CLOSING DEVICE AND PROBE APPARATUS

(75) Inventor: Tadashi Obikane, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 69 days.

(21) Appl. No.: 12/539,952

(22) Filed: Aug. 12, 2009

(65) Prior Publication Data

US 2010/0040441 A1   Feb. 18, 2010

(30) Foreign Application Priority Data

Aug. 13, 2008   (JP) .................................. 2008-208340
Jan. 23, 2009   (JP) .................................. 2009-013436

(51) Int. Cl.
*H01L 21/677* (2006.01)
(52) U.S. Cl. ...................... 414/217; 414/411; 414/937
(58) Field of Classification Search .................. 414/217, 414/217.1, 411, 937, 940
See application file for complete search history.

(56) References Cited

U.S. PATENT DOCUMENTS

| 4,856,904 A * | 8/1989 | Akagawa ....................... 356/400 |
| 6,048,154 A * | 4/2000 | Wytman ......................... 414/217 |
| 6,493,961 B2 * | 12/2002 | Ishii ................................... 34/82 |
| 6,835,039 B2 * | 12/2004 | van den Berg et al. ........ 414/217 |
| 2005/0238464 A1 * | 10/2005 | Matsuoka et al. ............. 414/217 |
| 2009/0087285 A1 * | 4/2009 | Mitsuyoshi ..................... 414/217 |

FOREIGN PATENT DOCUMENTS

| JP | 11-87460 | 3/1999 |
| JP | 2003-249537 | 9/2003 |
| JP | 2008-91597 | 4/2008 |
| KR | 10-0549786 | 2/2006 |

* cited by examiner

*Primary Examiner* — Saul Rodriguez
*Assistant Examiner* — Jonathan Snelting
(74) *Attorney, Agent, or Firm* — Oblon, Spivak, McClelland, Maier & Neustadt, L.L.P.

(57) ABSTRACT

A FOUP opening/closing device includes a housing containing a mounting table for mounting the FOUP thereon, an FOUP loading opening, and a delivery opening. The device further includes a rotator for rotating the mounting table, a door opening/closing unit to open or close the door of the FOUP and keep the door open, a mover for moving the FOUP and the door opening/closing unit in a reciprocating manner, to allow the FOUP and the door opening/closing unit to be connected to or separated from each other, and a controller to output control signals for moving the FOUP and the door opening/closing unit via operation of the mover to mount the door of the FOUP to the door opening/closing unit, separating the door from the FOUP, moving the FOUP and the door opening/closing unit away from each other, and rotating the mounting table to make the FOUP face the delivery opening.

19 Claims, 12 Drawing Sheets

FOUP OPENING/CLOSING DEVICE AND PROBE APPARATUS

FIELD OF THE INVENTION

The present invention relates to an opening/closing device to open or close a Front Opening Unified Pod (FOUP) serving as a hermetically sealed transfer container containing a plurality of substrates, and a probe apparatus having the opening/closing device.

BACKGROUND OF THE INVENTION

In semiconductor manufacturing processes, generally, semiconductor wafers are transferred to, e.g., a variety of processing apparatuses or inspecting apparatuses by using a Front Opening Unified Pod (FOUP) serving as a hermetically sealed transfer container, in order to reduce particle contamination of the wafers. The FOUP includes a door to open or close an opening formed on a front surface of a transfer container main body. For use of the FOUP, a load port located near a processing apparatus is provided with an FOUP mounting table and a door support. As the mounting table is moved to the door support, a key of the door support is engaged with a key hole of the door to secure the door to be opened and supported by the door support. The door support also serves to selectively expose a wafer transfer environment in a processing apparatus (e.g., a wafer inspecting apparatus) to the outside. Generally, the door support is moved downward after engaging with the door of the FOUP to support it, thereby allowing the opening of the FOUP to communicate with the wafer transfer environment (see Patent Document 1).

A probe apparatus for use in a final step of a semiconductor manufacturing process also includes a load port of a FOUP. The probe apparatus has a plurality of, e.g., two, probe units for the sake of enhanced probe test efficiency. This probe apparatus includes a loader in which two load ports are arranged to face each other across a standby region of a wafer transfer device, and the two probe units are arranged in the loader. In this configuration, an arm of the transfer device is moved downward after receiving a wafer from the FOUP and, then, is obliquely reciprocated leftward or rightward to deliver the wafer to a stage provided in any one of the probe units. However, since the door support is located lower than the FOUP, restrictions in layout including, e.g., a wafer delivery position on the stage of the probe unit, or a distance between the load ports are inevitable, in order to keep clear a space for the arm and the side of the door support.

Further, in case of increasing the number of probe units while maintaining a planar quadrilateral shape of the entire probe apparatus, center positions of the probe units located at both ends of the probe apparatus may be displaced because a Y-directional dimension of the entire probe apparatus is determined by a sum of dimensions of the probe units. Accordingly, in order to transfer wafers to the probe units located at both ends of the probe apparatus while avoiding contact with the door support, the load ports should protrude leftward or rightward beyond the probe units. In the probe apparatus in which the door of the FOUP is moved downward, effective utilization of a region below an FOUP mounting region is impossible and this hinders, e.g., arrangement of an electric unit or a pre-alignment unit.

To solve the above-described problem, Patent Document 2 discloses a configuration in which a door of an FOUP is opened and rotated laterally. However, the disclosed FOUP is not universally applicable and is not usable in practice.

[Patent Document 1] Japanese Patent Laid-open Publication No. 2008-91597 (Paragraph 0049)

[Patent Document 2] Japanese Patent Laid-open Publication No. 2003-249537 (Paragraph 0007)

SUMMARY OF THE INVENTION

In view of the above, the present invention provides a Front Opening Unified Pod (FOUP) opening/closing device, which may assure an effective utilization of a space below a region for loading of an FOUP and opening of a door of the FOUP. Further, the present invention provides a probe apparatus, which may assure a great degree of freedom in layout by virtue of the provision of the FOUP opening/closing device.

In accordance with a first aspect of the present invention, there is provided a Front Opening Unified Pod (FOUP) opening/closing device to open or close a door of an FOUP, comprising: a housing in which a mounting table for mounting the FOUP thereon is disposed; an FOUP loading opening formed on a front surface of the housing and configured to be opened or closed by a shutter; a delivery opening formed on a side surface of the housing to be used to deliver a substrate in the FOUP; a rotator for rotating the mounting table about a vertical axis; a door opening/closing unit disposed in the housing at a position of a rear surface of the housing to be used to open or close the door of the FOUP and keep the door open; a mover for moving the FOUP and the door opening/closing unit in a reciprocating manner relative to each other, so as to allow the FOUP and the door opening/closing unit to be connected to or separated from each other; and a controller to output control signals for moving the FOUP and the door opening/closing unit relative to each other via operation of the mover so as to mount the door of the FOUP to the door opening/closing unit, separating the door from the FOUP, moving the FOUP and the door opening/closing unit away from each other, and rotating the mounting table to make the FOUP face the delivery opening.

Further, in the FOUP opening/closing device, a rotating center of the mounting table may be eccentric from a center of the FOUP toward the FOUP loading opening.

In accordance with a second aspect of the present invention, there is provided a probe apparatus comprising: at least one FOUP opening/closing device, the device being described in the first aspect; a plurality of probe units arranged laterally at the rear surface of the housing and configured to inspect a substrate by using a probe card; and a transfer device configured to receive a substrate in the FOUP through the delivery opening and to transfer the substrate into each of the probe units while being moved below the delivery opening. Further, in the probe apparatus, at least one FOUP opening/closing device may include two FOUP opening/closing devices arranged to face each other across an arrangement region of the transfer device.

In an FOUP opening/closing device in accordance with the present invention, a door opening/closing unit is provided in a housing of a load port in which a mounting table for mounting an FOUP thereon is disposed, and the mounting table is rotated after a door of the FOUP is separated from the FOUP, so as to face the FOUP toward a substrate delivery opening of the housing. With this arrangement, it is unnecessary to provide a door storage region in a lower region of the housing, resulting in an effective utilization of a space below the load port (i.e., the FOUP opening/closing device). Further, in a probe apparatus having the FOUP opening/closing device in accordance with the present invention, the lower region of the housing in which the FOUP is mounted may be effectively utilized as, e.g., a substrate transfer path, resulting in a great degree of freedom in layout.

BRIEF DESCRIPTION OF THE DRAWINGS

The above and other objects and features of the present invention will become apparent from the following description of embodiments, given in conjunction with the accompanying drawings, in which.

DETAILED DESCRIPTION OF THE EMBODIMENT

First Embodiment

Figure 1:
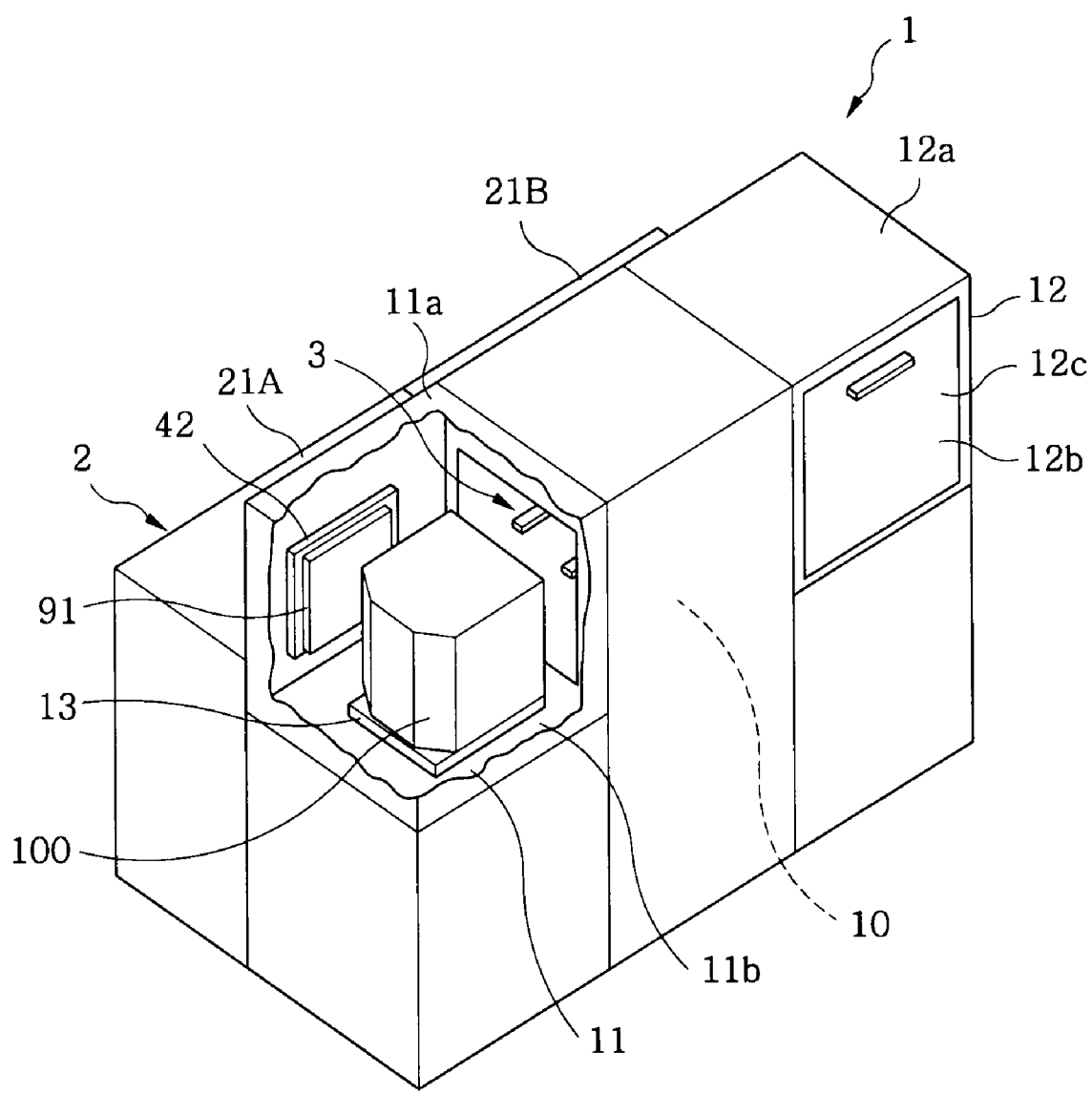
FIG. 1 is a perspective view schematically illustrating a probe apparatus in accordance with a first embodiment of the present invention.

Hereinafter, a probe apparatus having a Front Opening Unified Pod (FOUP) opening/closing device in accordance with the first embodiment of the present invention will be described. The probe apparatus, as shown in FIGS. 1 to 4, includes a loader 1 to deliver wafers W serving as substrates to be inspected, and a probe apparatus main body 2 to perform a probe test on the wafers W. First, an entire layout of the loader 1 and the probe apparatus main body 2 will be described in brief.

The loader 1 includes a first load port 11 and a second load port 12, which are arranged opposite to each other with a spacing therebetween in a Y-direction (a left-and-right direction in the drawing) and into each of which a hermetically-sealed transfer container (i.e., a carrier) receiving a plurality of wafers W is loaded, and a transfer chamber 10 located between the load ports 11 and 12. The first load port 11 and the second load port 12 correspond to the FOUP opening/closing device in accordance with the present invention. The load ports 11 and 12 respectively include housings 11a and 12a, and FOUP loading openings 11b and 12b are formed on front surfaces (at X-directional foremost sides) of the housings 11a and 12a, respectively, such that the FOUP 100 is loaded into or unloaded from the housings 11a and 12a through the FOUP loading openings 11b and 12b. The FOUP loading openings 11b and 12b are provided respectively with shutters 11c and 12c having handles, the shutters 11c and 12c being adapted to close the load ports 11 and 12 at their raised positions, and to open the load ports 11 and 12 at their lowered positions. The housings 11a and 12a respectively include mounting tables 13 and 14 therein for mounting of the FOUP 100.

Next, the load ports 11 and 12 (i.e., the FOUP opening/closing devices) which are essential parts of the present invention and the FOUP 100 to be loaded into the load ports 11 and 12 will be described in detail with reference to FIGS. 2 to 4. Here, the first load port 11 and the second load port 12 of the loader 1 are symmetrical to each other and have a same configuration and, therefore, the first load port 11 is representatively illustrated in FIGS. 3 and 4.

The housing 11a surrounds the load port 11 to define an external appearance thereof and has a delivery opening 11d for the wafers W from the FOUP 100 to communicate with the transfer chamber 10. The housing 11a includes a door opening/closing unit 42, as will be described hereinafter, that opens a door 91 of the FOUP 100 and keeps the door 91 open. While the FOUP loading opening 11b is formed on the front surface of the housing 11a, the door opening/closing unit 42 is located at a rear surface of the housing 11a. As shown in FIG. 4, at least one key 42a and at least one positioning pin 42b are provided at a surface of the door opening/closing unit 42 in contact with the door 91. The door opening/closing unit 42 includes a key rotator (not shown) to rotate the key 42a by 90 degrees. The door opening/closing unit 42 is configured to hold the door 91 by using the key 42a and the pin 42b when the door 91 of the FOUP 100 is opened. The door 91 is opened or closed by rotating the key 42a.

The mounting table 13 includes a mounting plate 60, a mover 61, and a rotating support 62. The mounting plate 60 has three positioning pins 63 and a claw 64 at a mounting surface for the FOUP 100, and a guide member 65 at the other surface thereof to guide the mounting plate 60. The mover 61 includes a drive source, e.g., an air cylinder, to move the mounting plate 60 in an X-direction along the guide member 65. The mover 61 moves the mounting plate 60 from a position for mounting of the FOUP 100 to a position for opening or closing of the door 91 that will be described hereinafter, i.e., a position where the key 42a of the door opening/closing unit 42 is fastened into a key hole 92 of the door 91. In other words, the FOUP 100 is fixedly positioned on the mounting plate 60 such that when the mounting plate 60 is moved toward the door opening/closing unit 42, the key 42a of the door opening/closing unit 42 is fastened into the key hole 92 of the door 91 of the FOUP 100, securing the door 91 to be kept at a fixed position.

A rotating shaft 41 of a rotator 40 is connected to the bottom of the rotating support 62, and the mounting plate 60 is provided on each mover 61. The rotator 40 rotates the mounting plate 60 by 90 degrees. Accordingly, the FOUP 100 is moved in an X-direction and rotated about a Z-axis (a vertical axis) by 90 degrees. A rotating center P1 of the mounting table 13 is eccentric to a center position P2 of the mounting table 13 and, more particularly, is displaced from a center position of the mounted FOUP 100 toward the transfer chamber 10 and the shutter 11c or 12c.

The FOUP 100 may include a plurality of receiving racks, e.g., twenty-five racks (not shown), to receive twenty-five wafers W therein. The FOUP 100 includes the door 91 to hermetically seal an opening of the FOUP 100, and the door 91 is provided with the key hole 92, at least one pin hole 93 and a latch (not shown). The key hole 92 is configured to be engaged with the key 42a of the door opening/closing unit 42. The pin hole 93 is to be engaged with the positioning pin 42b of the door opening/closing unit 42. The latch is operated as the key 42a is rotated in the key hole 92, causing the door 91 of the FOUP 100 to be locked or unlocked. A pedestal 94 is provided at the bottom of the FOUP 100. The pedestal 94 has positioning holes 95 and a protrusion 96 formed at a lower surface thereof to allow the FOUP 100 to be fixedly mounted on the mounting table 13. The positioning pins 63 of the mounting table 13 are configured to be fitted into the positioning holes 95 and the protrusion 96 is configured to be engaged with the claw 64 of the mounting table 13. When the FOUP 100 is mounted on the mounting plate 60, the positioning pins 63 are first fitted into the positioning holes 95 and then, the protrusion 96 is engaged with the claw 64. Accordingly, the FOUP 100 is fixedly positioned on the mounting plate 60.

Figure 2:
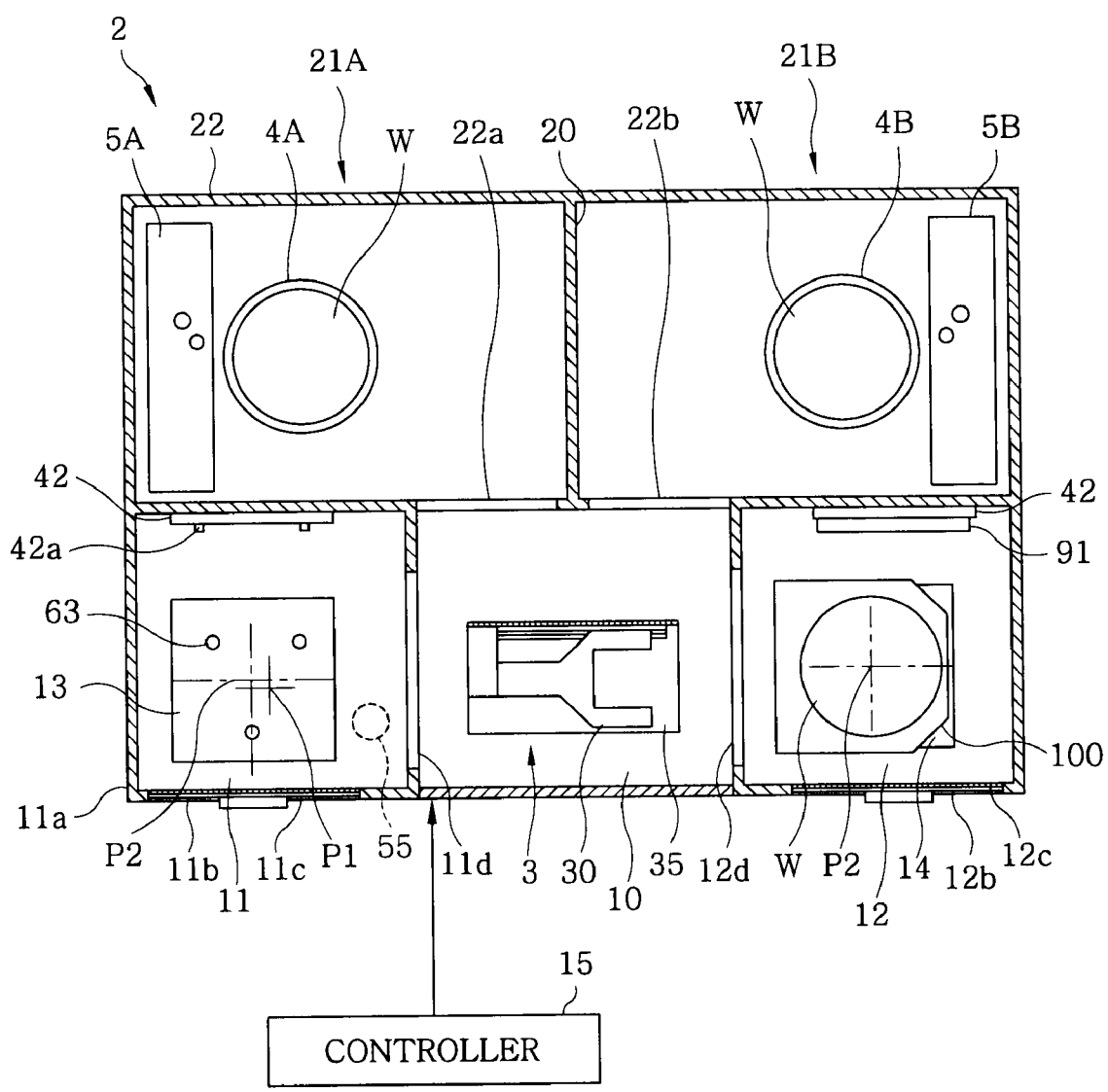
FIG. 2 is a plan view schematically illustrating the probe apparatus in accordance with the first embodiment.
Figure 3:
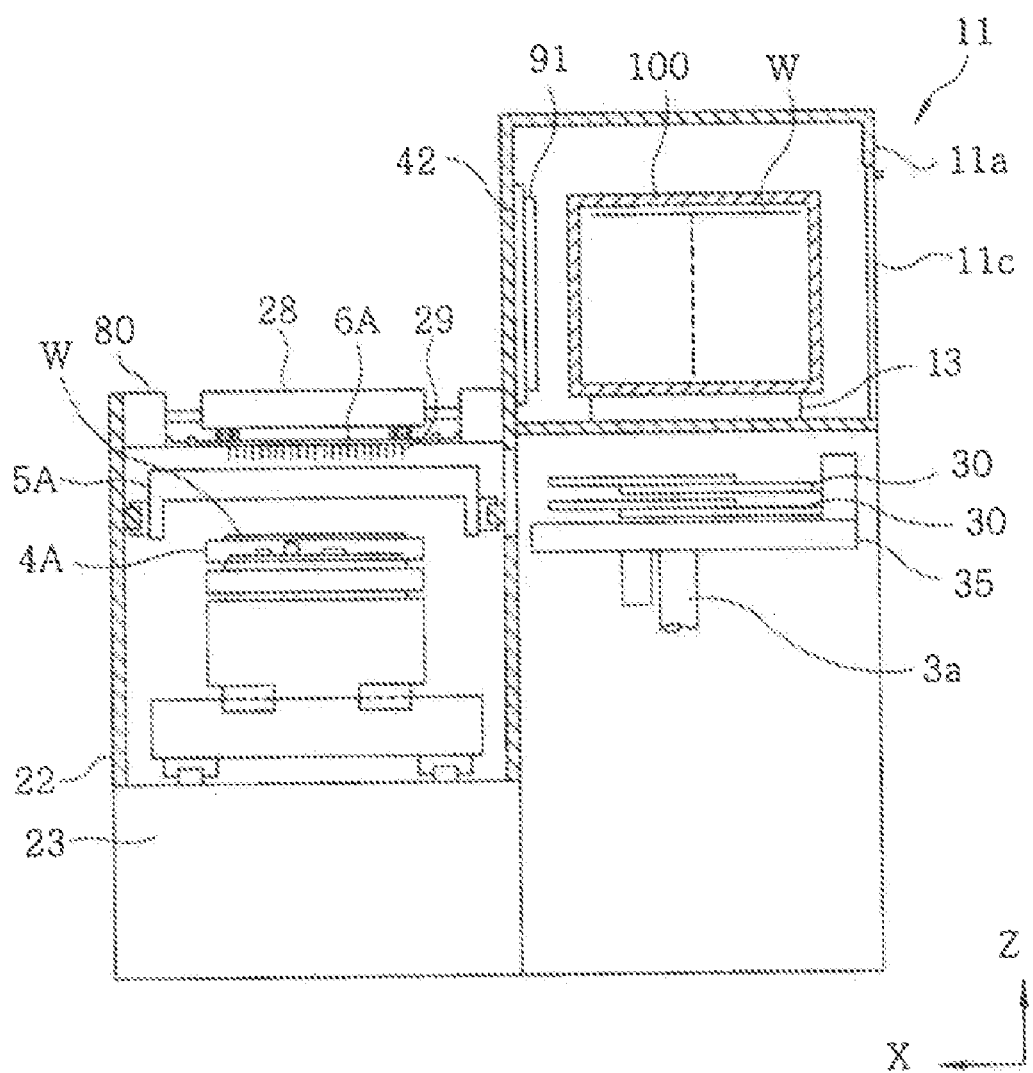
FIG. 3 is a side view schematically illustrating the probe apparatus in accordance with the first embodiment.
Figure 4:
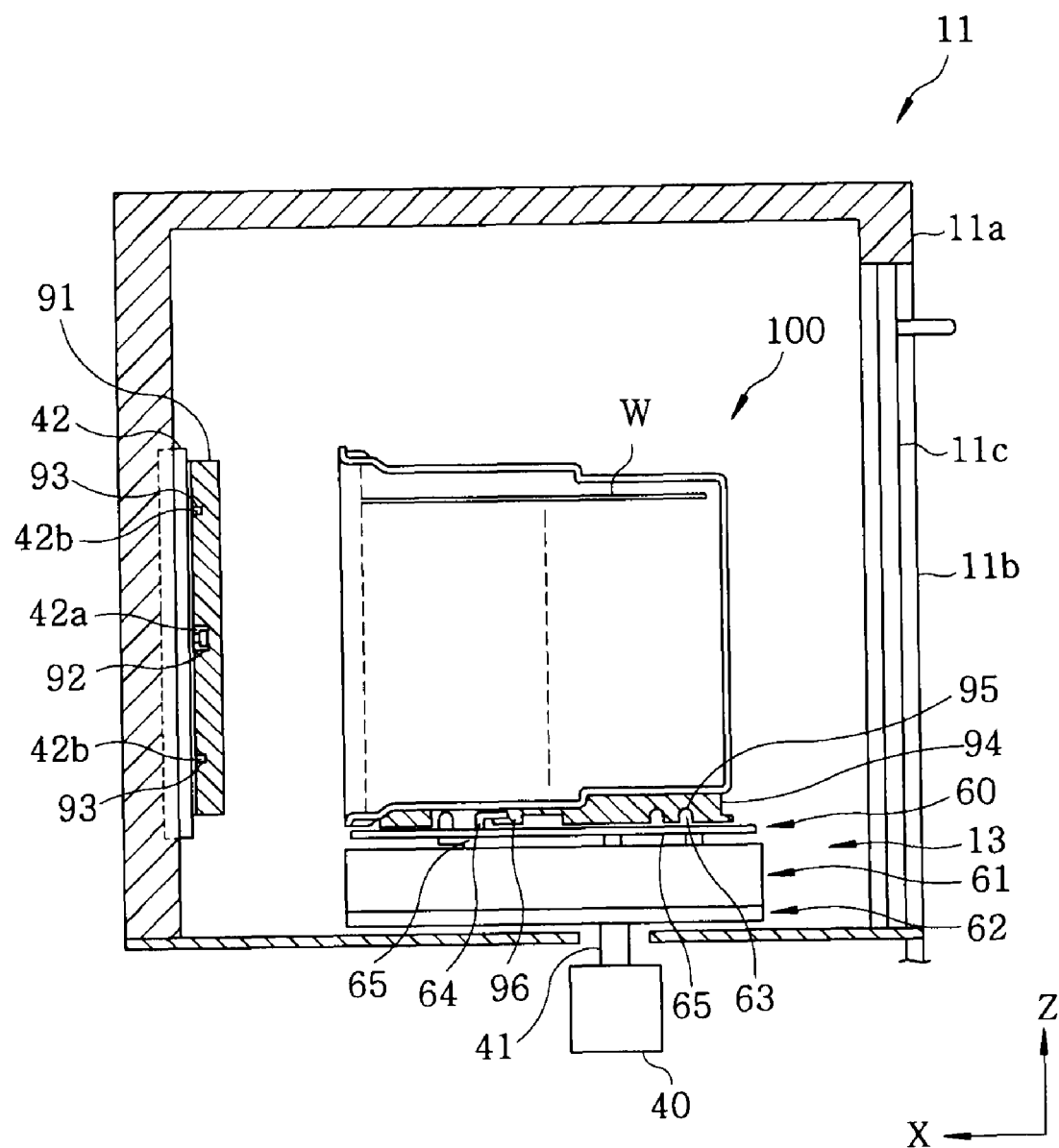
FIG. 4 is a side view schematically illustrating a load port in accordance with the first embodiment.

A wafer transfer arm 3 serving as a transfer unit is provided in the transfer chamber 10, as shown in FIGS. 2 and 3. The wafer transfer arm 3 includes a transfer base 35, a rotating shaft 3a for rotating the transfer base 35 about a vertical axis, and a lifter (not shown) for moving the rotating shaft 3a up and down. The transfer base 35 is provided with a plurality of, e.g., two, arm bodies 30 in a reciprocating manner. Both the arm bodies 30 move back and forth independently and serve to transfer the wafers W respectively. A rotating center of the rotating shaft 3a is positioned equidistantly from the two load ports 11 and 12. Also, the wafer transfer arm 3 is movable up and down between an upper position for delivery of the wafers W from the FOUP 100 and a lower position lower than the load ports 11 and 12 for delivery of the wafers W from a first probe unit 21A or a second probe unit 21B.

A pre-alignment unit is provided below the load port 11 at a position not interfering with the transfer of the wafers W to the probe apparatus main body 2. The pre-alignment unit includes a rotating stage and an optical detector to detect a peripheral edge of the wafer W. In FIG. 2, reference numeral '55' represents the rotating stage of the pre-alignment unit. The pre-alignment unit pre-aligns the wafer W received from the wafer transfer arm 3, thus regulating an orientation of the wafer W while detecting a center position of the wafer W.

The probe apparatus main body 2 is arranged to be located close to the loader 1 in an X-direction of the loader 1. The probe apparatus main body 2 includes a casing 22 defining an outer shell thereof. The casing 22 is divided into two parts by a partition wall 20 erected along a Y-direction, both the parts corresponding to outer shells respectively defining the first probe unit 21A and the second probe unit 21B. The first probe unit 21A includes a wafer chuck 4A serving as a substrate mounting table, an alignment bridge 5A serving as a moving photographing unit having a camera to be moved above the wafer chuck 4A in a Y-direction (i.e., a direction connecting the load ports 11 and 12), and a probe card 6A provided at a head plate 80 defining the ceiling of the casing 22. Similarly, the second probe unit 21B includes a wafer chuck 4B, an alignment bridge 5B and a probe card 6B.

In the casing 22 of the probe apparatus main body 2, strip-shaped transfer openings 22a and 22b extending in a Y-direction (see FIG. 2) are formed at a sidewall of the casing 22 toward the loader 1, such that the wafers W are delivered from/to the first probe unit 21A and the second probe unit 21B. Wafer delivery positions, wafer surface photographing positions and probe card installation positions of both the first probe unit 21A and the second probe unit 21B are symmetrical about a line which passes through a rotating center of the wafer transfer arm 3 and is perpendicular to a line connecting the first and second load ports 11 and 12 to each other. Further, the first probe unit 21A and the second probe unit 21B have a same configuration. Therefore, only the first probe unit 21A will be described hereinafter with reference to FIGS. 2 and 3 to avoid repetition of description.

The wafer chuck 4A in the probe unit 21A is coupled with a table unit 23, to be freely moved in X-, Y- and Z-directions and to be rotated about a vertical axis. The wafer chuck 4A is movable to a wafer delivery position for wafer delivery from/to the wafer transfer arm 3, a wafer surface photographing position, and a contact position (an inspecting position) where the wafer W comes into contact with probe needles 29 of the probe card 6A, which will be described later.

The probe card 6A is located above a movement region of the wafer chuck 4A, and a pogo pin unit 28 is provided above an upper surface of the probe card 6A. Although a test head (not shown) is generally arranged on an upper surface of the pogo pin unit 28, in this embodiment, a test head is arranged separately from the probe apparatus main body 2 and the pogo pin unit 28 is connected to the test head via a cable (not shown). A lower surface of the probe card 6A is provided with probes electrically connected to a group of electrodes provided at the upper surface of the probe card 6A. For example, the probes may be vertical needles (wire probe needles) extending perpendicular to a surface of the wafer W and may be distributed, e.g., over the entire surface of the probe card 6A to correspond to an electrode pad array of the wafer W. The alignment bridge 5A is provided with a CCD camera to photograph the surface of the wafer W.

As shown in FIG. 2, the probe apparatus includes, e.g., a computer type controller 15, and the controller 15 is provided with, e.g., a data processor including a program, a memory and a CPU. The controller 15 controls, based on the program, a series of operations including steps of loading the FOUP 100 into the load port 11 or 12, performing a probe test on the wafer W, returning the wafer W into the FOUP 100, and unloading the FOUP 100 from the load port 11 or 12. Programs (including programs regarding display or input operations of process parameters) installed in the controller 15 are stored in a memory medium such as a flexible disc, compact disc, Magnetic Optical (MO) disc, or hard disc.

Figure 5A:
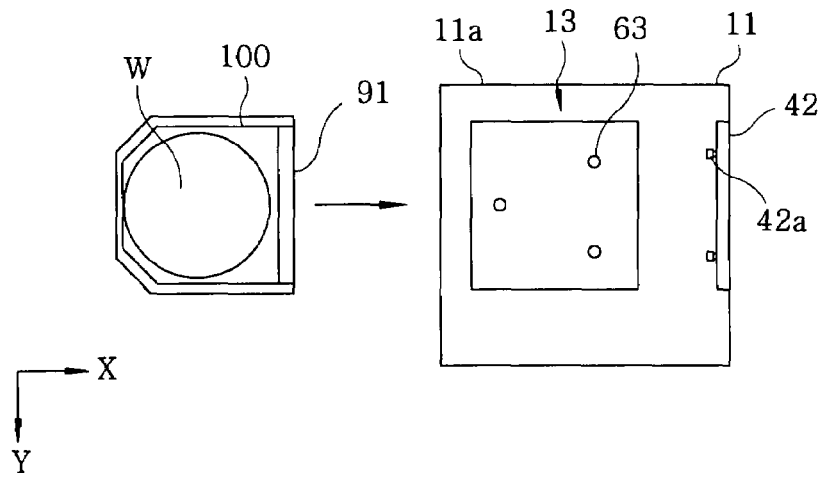
FIGS. 5A to 5C are first explanatory views of an FOUP mounting method.
Figure 5B:
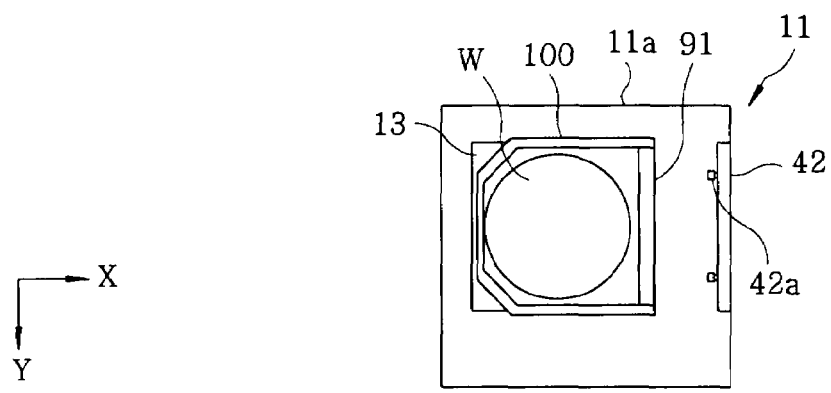

Next, operation and effects of the above-described embodiment will be described. First, a detailed opening/closing operation of the door 91 will be described with reference to FIGS. 5A to 6C. Here, since the first load port 11 and the second load port 12 of the loader 1 are symmetrical to each other and have the same configuration, FIGS. 5A to 6C illustrate only the configuration of the first load port 11 as a representative example. In FIGS. 5A to 6C, for convenience of description, only the interior of the housing 11a, the FOUP 100, the mounting table 13 and the door opening/closing unit 42 are illustrated and a description of other parts will be omitted. First, the shutter 11c of the load port 11 is opened to load the FOUP 100 into the load port 11 through the FOUP loading opening 11b as shown in FIG. 5A. Next, the FOUP 100 is positioned on the mounting table as the positioning pins 63 are fitted into the positioning holes 95 of the pedestal 94 as described above. When the positioning of the FOUP 100 is completed, the protrusion 96 is engaged with the claw 64 to fix the FOUP 100 on the mounting plate 60. FIG. 5B illustrates the fixed state of the FOUP 100.

Figure 5C:
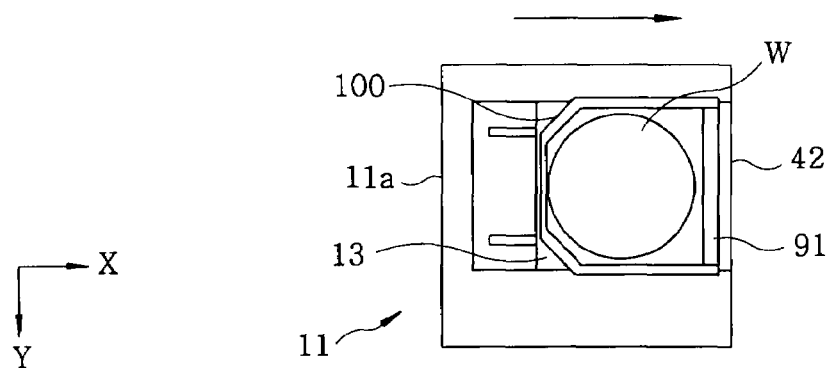
Figure 6A:
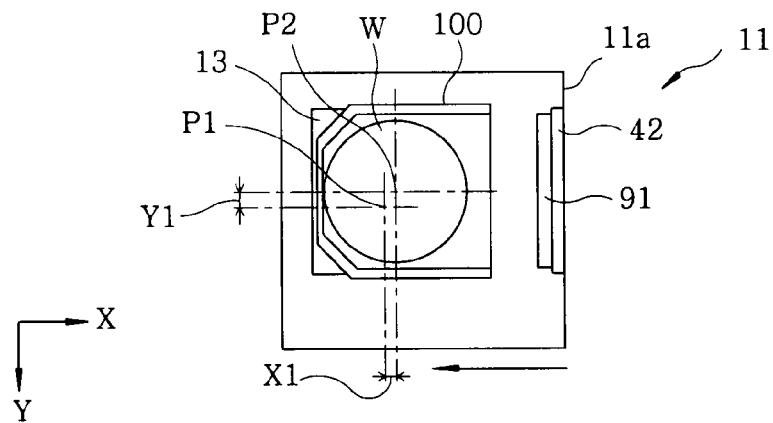
FIGS. 6A to 6C are second explanatory views of the FOUP mounting method.

After fixing the FOUP 100, as shown in FIG. 5C, the mounting plate 60 is moved toward the door opening/closing unit 42 such that the key 42a of the door opening/closing unit 42 is engaged with the key hole 92 of the door 91 and the pin 42b is fitted into the pin hole 93. Once the key 42a is engaged with the key hole 92, the key 42a is rotated to unlock the door 91 to allow the door opening/closing unit 42 to hold and support the door 91. Then, when the FOUP 100 is moved away from the door opening/closing unit 42, as shown in FIG. 6A, the door opening/closing unit 42 holds and supports the unlocked door 91, and the opening of the FOUP 100 is opened.

Figure 6B:
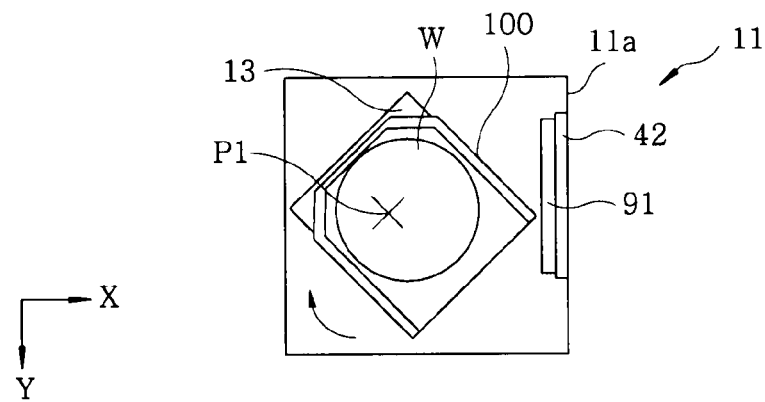
Figure 6C:
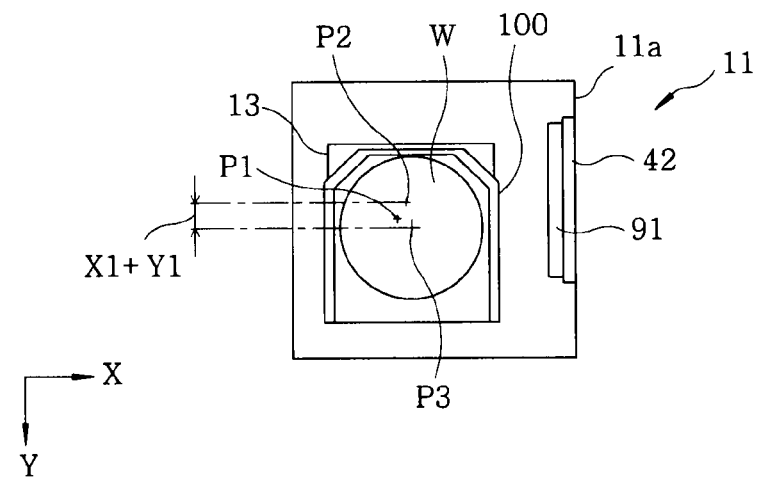

If the opening of the FOUP 100 is opened, as shown in FIG. 6B, the rotator 40 is operated to rotate the FOUP 100 such that the opening of the FOUP 100 faces the delivery opening 11d. In this case, as shown in FIG. 6A, the rotating center P1 of the mounting table 13 is eccentric to the center position P2 of the mounting table 13 and is displaced in an X-direction from the center position P2 toward the FOUP loading opening 11b by a distance X1 and in a Y-direction from the center position P2 toward the delivery opening 11d by a distance Y1. Accordingly, as shown in FIG. 6C, if the mounting table 13 is rotated by 90 degrees to allow the opening of the FOUP 100 to face the delivery opening 11d, the center position P2 of the mounting table 13 may be moved in a Y-direction toward the delivery opening 11d by a sum of the distances X1 and Y1. Thus, a center position P3 of the wafer W received in the FOUP 100 is moved from an original position thereof P2 before rotation of the mounting table 13 toward the delivery opening 11d by a sum of the distances X1 and Y1.

Figure 7:
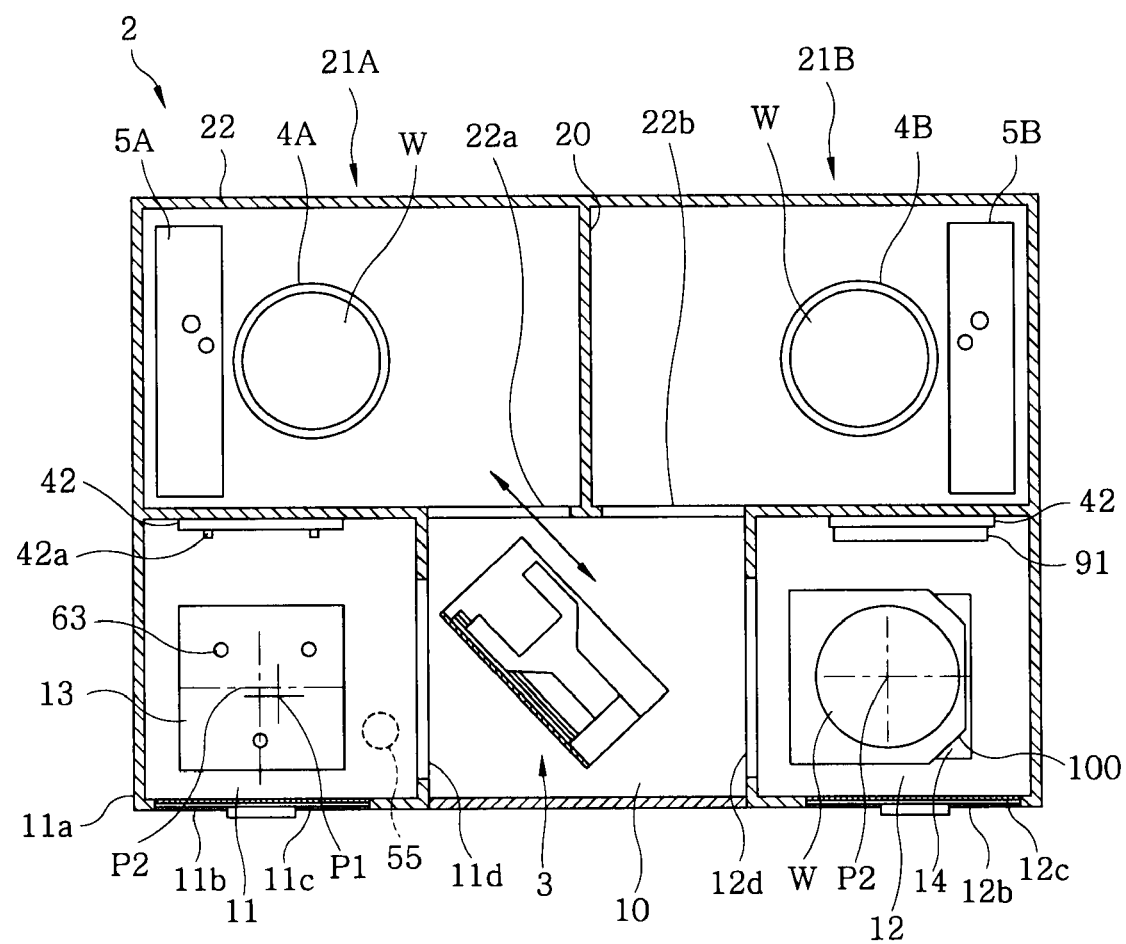
FIG. 7 is an explanatory view of wafer delivery in the probe apparatus.

As shown in FIG. 6C, after the opening of the FOUP 100 is directed to face the delivery opening lid, the wafer W is taken out of the FOUP 100 by the wafer transfer arm 3. Thereafter, the wafer W, taken out of the FOUP 100 by the wafer transfer arm 3, is transferred to the rotating stage 55 of the pre-alignment unit. During a pre-alignment operation, an orientation of the wafer W is regulated to face a notch corresponding to the probe unit 21A and the center position of the wafer W is detected. After the pre-alignment operation is completed, the wafer transfer arm 3 receives the wafer W in accordance with data obtained by the pre-alignment operation such that the center of the wafer W coincides with the center of a wafer holding region of the wafer transfer arm 3 and, then, transfers the wafer W by passing below the load port 11. The wafer W is loaded into the probe unit 21A through the transfer opening 22a and, then, is delivered to the wafer chuck 4A. FIG. 7 illustrates the delivery of the wafer W in brief.

After the wafer W is loaded into the probe unit 21A, the CCD camera (not shown) of the alignment bridge 5A photographs electrode pads of the wafer W and, simultaneously, a lower camera (not shown) near the wafer chuck 4A photographs tips of the probe needles 29 of the probe card 6A. During a photographing operation using both the cameras, specific X-, Y-, and Z-directional coordinates in a driving system of the wafer chuck 4A are calculated and the wafer W is moved to a contact position obtained based on the coordinates. Then, the probe needles 29 come into contact with the electrode pads of the wafer W, and a probe test for measuring electrical characteristics of each chip is carried out by using a tester (not shown) connected to the probe card 6A via the test head. After completion of the probe test, the wafer W is returned into the FOUP 100 without being transferred to the pre-alignment unit. These serial operations are implemented under the control of the controller 15 based on a test program stored in the controller 15.

After the probe test is completely carried out for the wafer W transferred to the probe unit 21A, the wafer W is returned to the FOUP 100 by the wafer transfer arm 3. After all the wafers W in the FOUP 100 are completely subjected to the probe test, the door 91 is mounted to the FOUP 100 and the FOUP 100 is unloaded from the load port 11 by performing the above-described operations in reverse order.

As described above, in the probe apparatus of this embodiment, the door opening/closing unit 42, which opens the door 91 of the FOUP 100 and keeps the door 91 open, is provided in each of the load ports 11 and 12, and the wafer transfer arm 3 rotates the FOUP 100 from which the door 91 is removed, thereby causing the FOUP 100 to face the delivery opening 11d. This configuration makes it unnecessary to have a conventional device to move and hold the door 91 below the load port 11 or 12. Not providing the door 91 below the load port 11 or 12 allows a region, which has been conventionally used as a storage region for the door 91, to be effectively used as, e.g., a transfer region for the wafer W as described in this embodiment. Further, since the wafer W may be transferred to pass below the load port 11 or 12 when being loaded into or unloaded from the probe unit 21A or 21B, a degree of freedom in a delivery position of the wafer chuck 4A or 4B increases and, thus, the probe apparatus may be easily designed such that outer cross sections of both shoulders thereof coincide with each other without making both outer ends of the load ports 11 and 12 protrude outward in a Y-direction beyond outer ends of the probe units 21A and 21B. Accordingly, this embodiment has the effect of efficiently utilizing a region below the load port 11 or 12 in which the FOUP 100 is loaded as, e.g., a transfer region for the wafer W and achieving a great degree of freedom in layout.

Further, since the rotating center P1 of the mounting table 13 is eccentric to the center position P2 of the mounting table 13, the center position of the wafer W received in the FOUP 100 may be displaced from the original position of the mounting table 13 before rotation thereof toward the delivery opening 11d by a sum of the distances X1 and Y1 when the opening of the FOUP 100 faces the delivery opening 11d. This eliminates or restricts an increase in the stroke of the wafer transfer arm 3, allowing an advantageous size reduction of the wafer transfer arm 3.

Second Embodiment

Now, a probe apparatus in accordance with the second embodiment of the present invention will be described with reference to FIGS. 8 to 11C. The probe apparatus of the second embodiment has approximately the same configuration as that of the first embodiment except for the interior configuration of the load port 11. Thus, the same or like parts as those in the first embodiment are designated by the same reference numerals. In the second embodiment, differently from the first embodiment in which the FOUP 100 is moved back and forth, a door opening/closing unit 242 is moved back and forth to open or close the door 91 in a stationary state of the FOUP 100. In the following description of the second embodiment, only the load port 11 and elements related to the load port 11 will be described.

Figure 8:
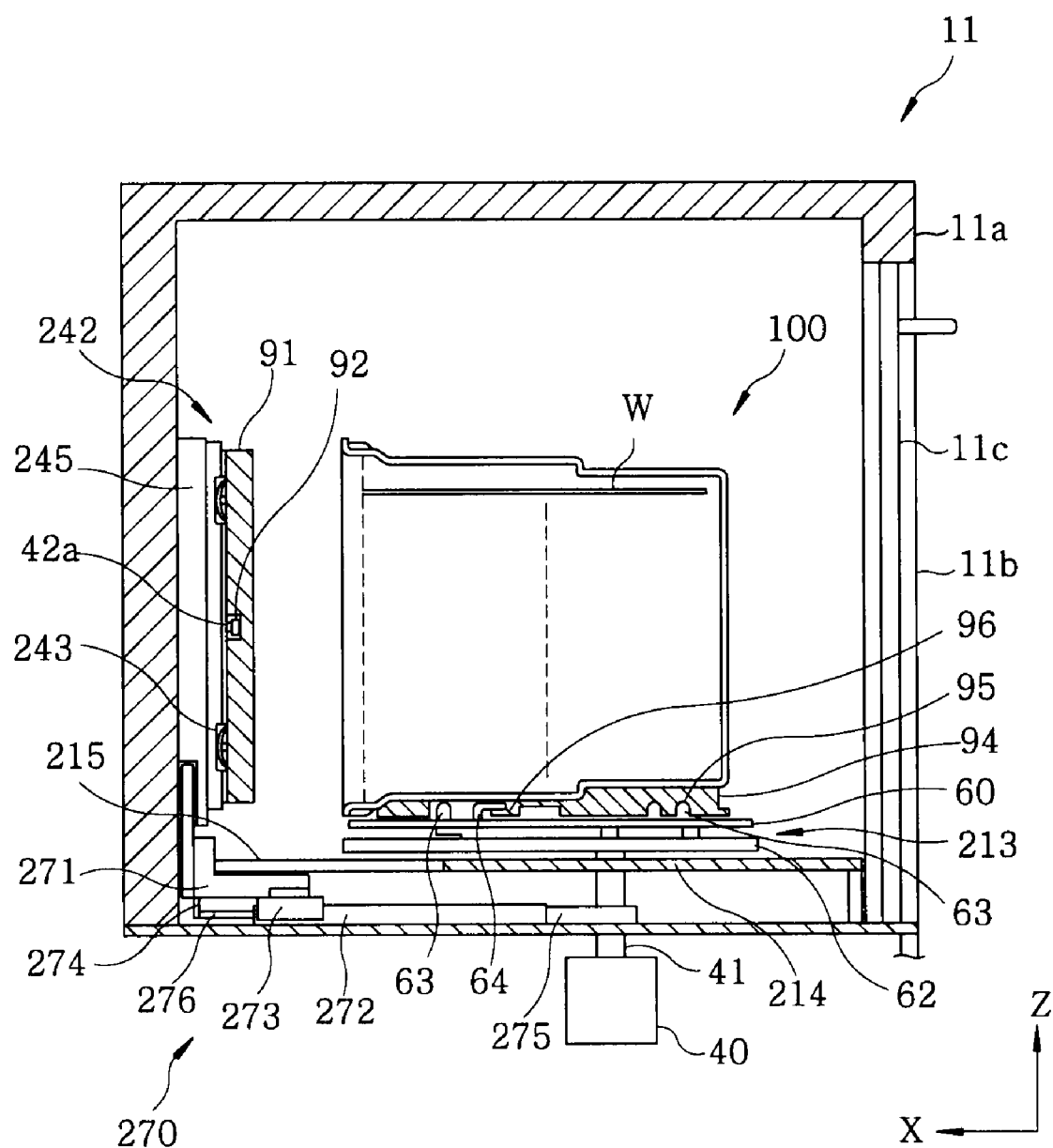
FIG. 8 is a cross sectional view schematically illustrating a load port in accordance with a second embodiment of the present invention.
Figure 11A:
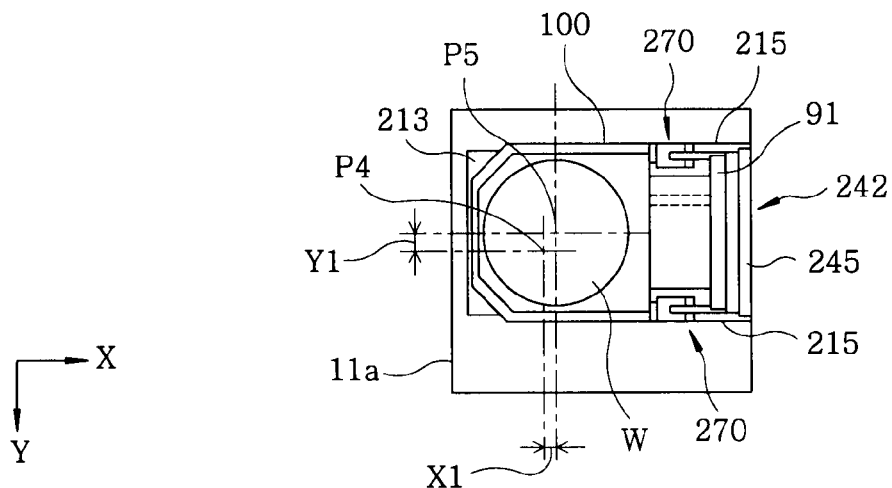
FIGS. 11A to 11C are second explanatory views of the FOUP mounting method in accordance with the second embodiment.

As shown in FIG. 8, the housing 11a of the load port 11 includes a mounting table 213 and the door opening/closing unit 242. The mounting table 213 includes the mounting plate 60 and the rotating support 62, and the rotating shaft 41 is connected to the bottom of the rotating support 62. In this embodiment, the mover 61, which is provided underneath the mounting plate 60 in the first embodiment, is omitted because the FOUP 100 mounted on the mounting table 213 is not moved back and forth. A rotating center P4 of the mounting table 213 (see FIGS. 11A to 11C) is eccentric to a center position P5 of the mounting table 213 (see FIG. 11A) and, more particularly, is displaced from a center position of the mounted FOUP 100 to the transfer chamber 10 and the FOUP loading opening 11b (inside of FIG. 8 and see FIG. 2). Accordingly, as shown in FIG. 11C, if the mounting table 213 is rotated by 90 degrees to allow the opening of the FOUP 100 to face the delivery opening 11d (FIG. 2), a center position P6 of the wafer W received in the FOUP 100 is moved from an original position thereof P5 before rotation of the mounting table 213 toward the delivery opening 11d (FIG. 2) in the same manner as described with respect to FIGS. 6A to 6C.

Figure 9:
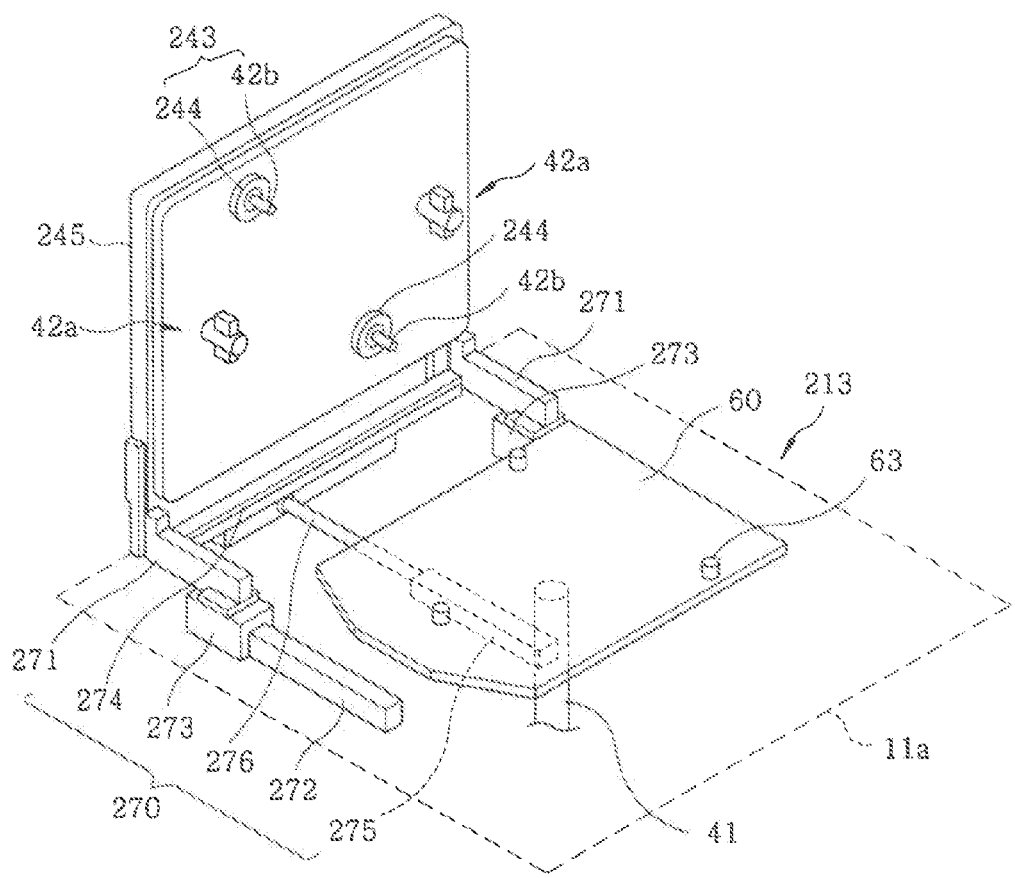
FIG. 9 is a perspective view schematically illustrating the load port in accordance with the second embodiment.

As shown in FIGS. 8 and 9, the door opening/closing unit 242 is located at the rear surface of the housing 11a while the FOUP loading opening 11b is formed on the front surface of the housing 11a. The door opening/closing unit 242 includes an upright support plate 245 arranged approximately parallel to the rear surface of the housing 11a and supported at both left and right ends of a lower portion thereof by support arms 271 that will be described hereinafter. The support plate 245 is provided at a front surface thereof (i.e. a surface toward the mounting table 213) with the key 42a and at least one sucking device 243.

The sucking device 243, as shown in FIG. 9, includes a sucker 244 and the positioning pin 42b provided at the center of the sucker 244. After the pin 42b is fitted into the pin hole of the door 91 to position the door 91, the sucker 244 is configured to suck the door 91. In the door opening/closing unit 242, the door 91, which is opened or closed by the key 42a, is configured to be adsorbed by a rear surface of the support plate 245 via suction.

A cover 214 in the form of a flat rectangular box is provided at a bottom portion of the housing 11a, to cover the entire bottom surface of the bottom portion. A reciprocating device 270 is provided inside the cover 214. The cover 214 is provided with slits 215 at an upper surface thereof that corresponds to a movement region of the support arms 271 that will be described hereinafter, and the mounting table 213 is located above the cover 214. The rotating shaft 41 is connected to the bottom of the rotating support 62 after passing through the cover 214 and the housing 11a. In FIG. 9, for convenience of illustration, the housing 11a and the cover 214 are omitted.

The reciprocating device 270 serves as a mover to reciprocate the door opening/closing unit 242 from the rear surface of the housing 11a to the mounting table 213. The reciprocating device 270 includes two guide rails 272 arranged at both sides of the bottom surface of the housing 11a to extend in an X-direction (forward/backward direction). A moving member 273 is attached to each of the guide rails 272 and is adapted to move on the guide rail 272. One end of the support arm 271 used to support the support plate 245 is attached to the moving member 273.

The support arm 271 is an L-shaped member having one end attached to the moving member 273 and the other end connected to the left or right end of the lower portion of the support plate 245 as described above. A pair of the support arms 271 is connected to each other via a connecting bar 274, and the connecting bar 274 has an approximately L-shaped X-directional cross section corresponding to a root portion of the L-shaped support arm 271.

A cylinder 275, such as, e.g., an air cylinder, is provided between both the guide rails 272 and serves as a drive source of the reciprocating device 270. As shown in FIG. 9, the cylinder 275 is provided at the bottom portion of the housing 11a, so as not to overlap with the rotating shaft 41 on an X-Y plane of the housing 11a and to allow a piston rod 276 to be extended or retracted in a direction parallel to the guide rails 272. A tip end of the piston rod 276 is connected to the connecting bar 274.

The reciprocating device 270 is configured to reciprocate in an X-direction as the piston rod 276 is extended or retracted. When the piston rod 276 is retracted, the door opening/closing unit 242 supported by the reciprocating device 270 is moved toward the mounting table 213, and when the piston rod 276 is extended, the door opening/closing unit 242 is moved toward the rear surface of the housing 11a. That is, the door opening/closing unit 242 supported by the reciprocating device 270 is movable back and forth in the X-direction under the guidance of the guide rails 272.

The sucking device 243 is connected to a sucking pump (not shown) via a sucking tube (not shown) The cylinder 275 is connected to a power source such as an air source (not shown). The controller 15 controls, e.g., supply of power from the power source to the reciprocating device 270.

Figure 10A:
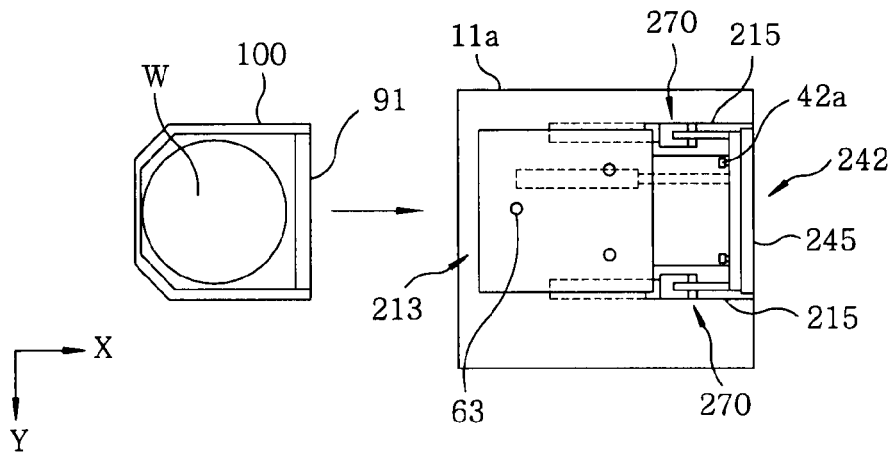
FIGS. 10A to 10C are first explanatory views of an FOUP mounting method in accordance with the second embodiment.
Figure 10B:
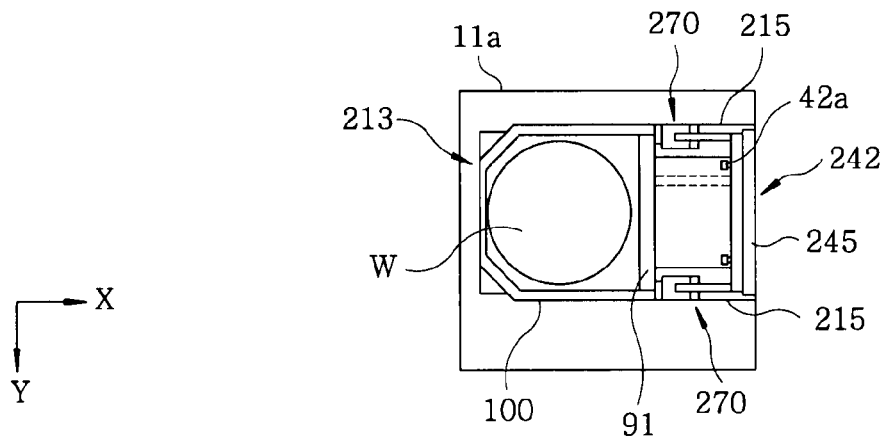

Next, an opening/closing operation of the door 91 in accordance with the second embodiment will be described with reference to FIGS. 8 to 11C. Here, in FIGS. 10A to 11C, for convenience of description, only the interior of the housing 11a of the load port 11, the FOUP 100, the mounting table 213, the door opening/closing unit 242, and the reciprocating device 270 are partially illustrated, and a description of other parts is omitted. First, the shutter 11c of the load port 11 shown in FIG. 8 is opened to load the FOUP 100 into the load port 11 through the FOUP loading opening 11b as shown in FIG. 10A. Next, the positioning pins 63 are fitted into the positioning holes 95 as described above (see FIG. 8) and the protrusion 96 is engaged with the claw 64, thus fixing the FOUP 100 onto the mounting table 213. FIG. 10B illustrates the fixed state of the FOUP 100.

Figure 10C:
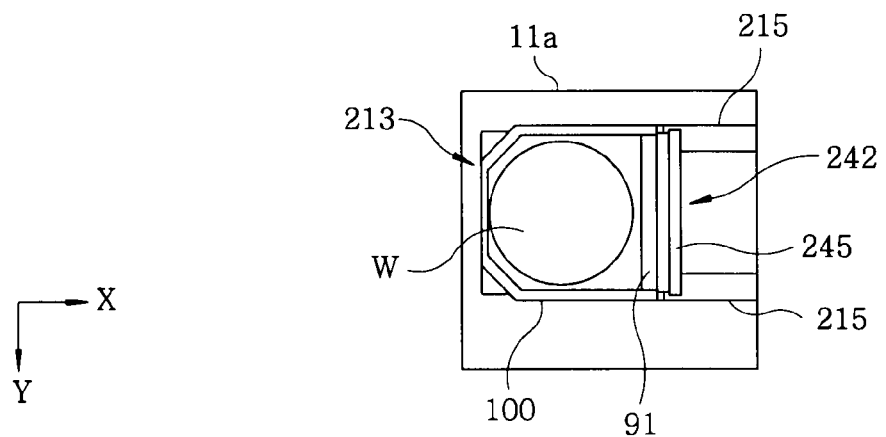

After fixing the FOUP 100, as shown in FIG. 10C, the door opening/closing unit 242 is moved forward toward the FOUP 100 such that the key 42a of the door opening/closing unit 242 is engaged with the key hole 92 of the door 91 and the pin 42b is fitted into the pin hole (not shown). Once the pin 42b is fitted into the pin hole, the door 91 is caught by the door opening/closing unit 242 by suction of the sucking device 243. Then, the key 42a fitted into the key hole 92 is rotated to unlock the door 91. If the door opening/closing unit 242 is retracted in the unlocked state of the door 91, as shown in FIG. 11A, the unlocked door 91 is moved toward the rear surface of the housing 11a together with the door opening/closing unit 242 while being caught by the door opening/closing unit 42 via suction. Accordingly, the opening of the FOUP 100 is opened.

Figure 11B:
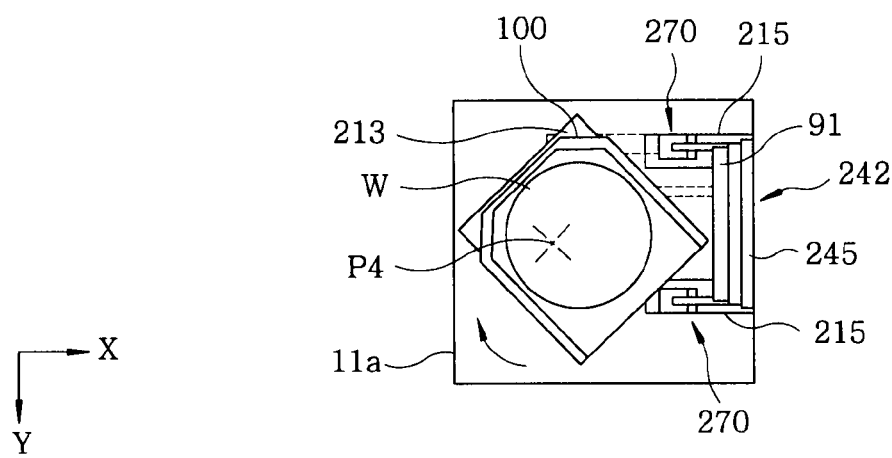
Figure 11C:
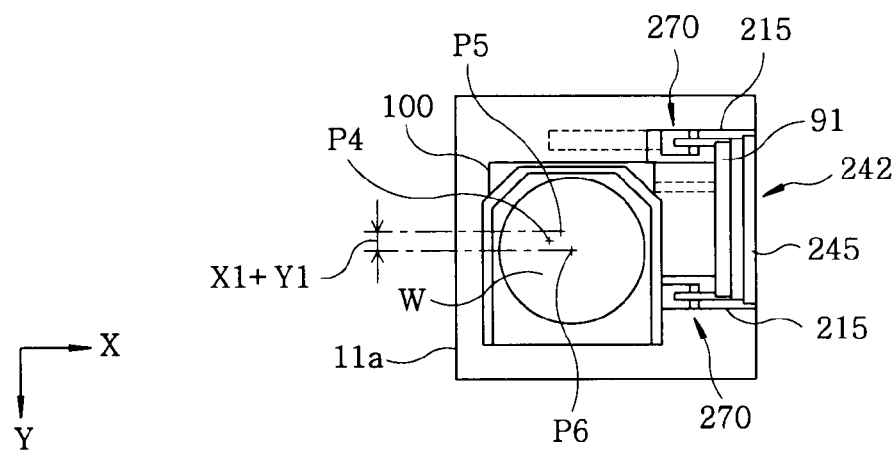

Thereafter, in the same way as the first embodiment, as shown in FIG. 11B, the FOUP 100 is rotated until the opening of the FOUP 100 faces the delivery opening 11d. Then, as shown in FIG. 11C, after the opening of the FOUP 100 is directed to face the delivery opening 11d, the wafer W is taken out of the FOUP 100 by the wafer transfer arm 3 (see FIG. 2) and is subjected to a probe test in the same way as in the first embodiment. After completion of the probe test, the wafer W is returned to the FOUP 100. After all the wafers W in the FOUP 100 are subjected to the probe test, the door 91 is mounted to the FOUP 100 and the FOUP 100 is unloaded from the load port 11 by performing the above-described operations in reverse order.

As described above, also in the probe apparatus of the second embodiment, the door opening/closing unit 242, which opens the door 91 of the FOUP 100 and keeps the door 91 open, may be provided in each of the load ports 11 and 12, and the door 91 may be kept in the load port 11 or 12. This configuration makes it unnecessary to have a conventional device to move and hold the door 91 below the load port 11 or 12 and enables an effective utilization of a region that has been conventionally used as a storage region for the door. Accordingly, in the same way as the first embodiment, the second embodiment has the effect of efficiently utilizing a region below the load port 11 or 12 in which the FOUP 100 is loaded as, e.g., a transfer region for the wafer W and achieving a great degree of freedom in layout.

In the second embodiment, the door opening/closing unit 242 rather than the mounting table 213 is moved back and forth, allowing the door 91 to be opened or closed without reciprocating movement of the FOUP 100. Accordingly, the FOUP 100, the opening of which is opened, does not move back and forth. This prevents the wafer W accommodated in the FOUP 100 from protruding from the opening due to the reciprocating movement of the FOUP 100.

In the above-described respective embodiments, the probe apparatus is configured such that two probe units are arranged in a line along the loader including the two load ports and the single transfer chamber. However, the present invention may be applied to any other probe apparatuses in which a plurality of, e.g., three or more, probe units are arranged along the loader including the two load ports and the single transfer chamber.

Figure 12:
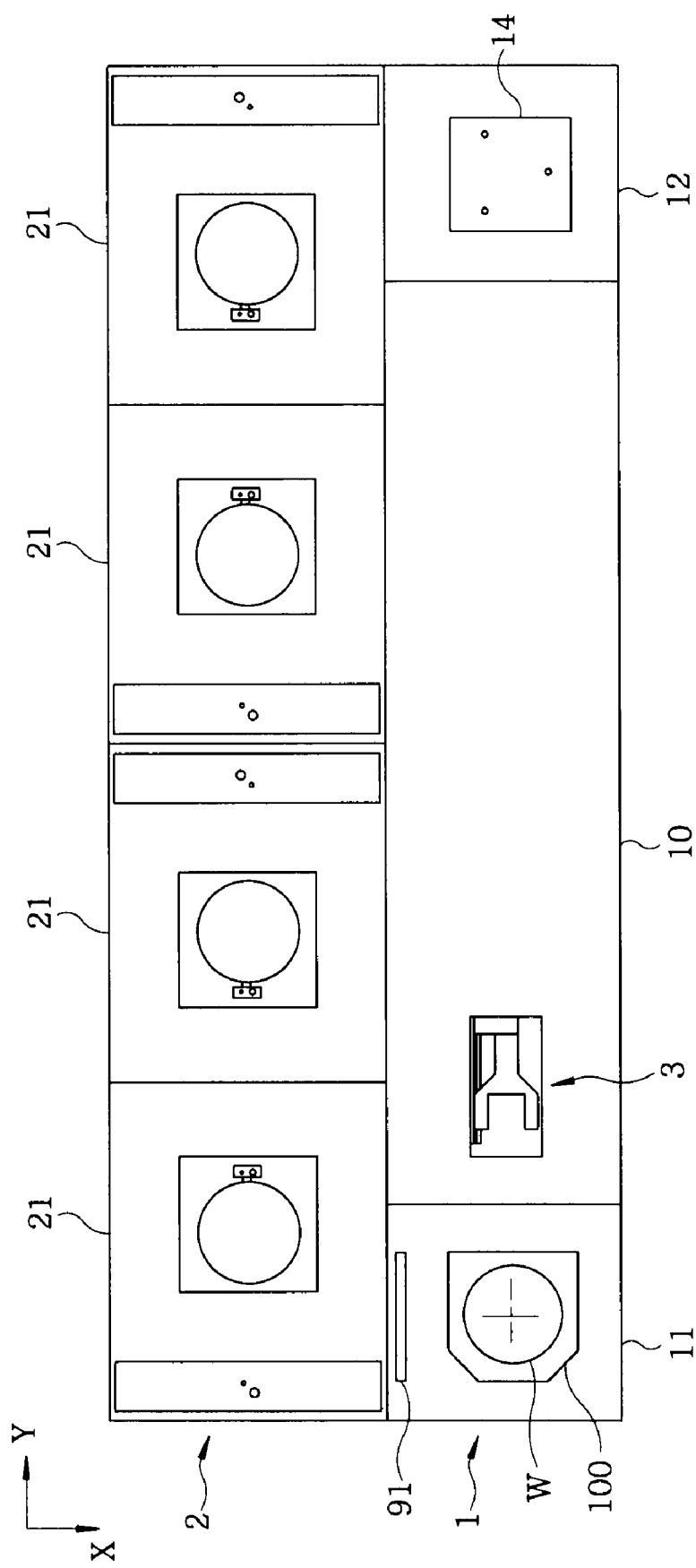
FIG. 12 is a perspective view illustrating a probe apparatus in accordance with another embodiment of the present invention.

For example, as shown in FIG. 12, a probe apparatus may include a probe apparatus main body 2 in which four probe units 21 having the same configuration as the probe units 21A and 21B of the above-described embodiments are arranged in a line in a Y-direction along the loader 1. In the case of the probe apparatus main body 2 including the four probe units 21, it is necessary to design the loader to load the wafer W into all the probe units 21.

Conventionally, it has been necessary for a width of the transfer chamber to coincide with a width of the probe apparatus main body because wafers are loaded only from the transfer chamber of the loader into the probe units. Therefore, there is a problem in that the loader may be longer than the probe apparatus main body by a length of the load port and a Y-directional lateral portion of the loader may protrude from the probe apparatus main body.

However, as shown in FIG. 12, in the probe apparatus having the load ports 11 and 12 (i.e., the FOUP opening/closing device) in accordance with the present invention, a region below the load ports 11 and 12 may be used as a transfer region for the wafer W. It provides the effect of reducing a Y-directional width of the transfer chamber 10 in proportion to the load ports 11 and 12 and making the Y-directional width of the loader 1 coincide with the Y-directional width of the probe apparatus main body 2.

That is, the probe apparatus having the FOUP opening/closing device of the present invention, in which a plurality of the probe units is arranged to form the probe apparatus main body, has a more remarkable effect in easy design of a configuration in which outer cross sections of both shoulders thereof coincide with each other without a risk that both outer ends of the load ports (the FOUP opening/closing device) protrude outward in a Y-direction beyond outer ends of the probe apparatus main body.

The FOUP opening/closing device of the present embodiment may be applied to a probe apparatus using a single probe unit. Even in this case, a region below the load port (the FOUP opening/closing device) may be used as a transfer region of the wafer W, resulting in a great degree of freedom in layout. Further, an electric system or control system unit, a pre-alignment unit or the like may be arranged in the region, thereby providing efficient utilization of the region.

Further, in the first embodiment, the door 91 is caught by the door opening/closing unit 42 as the key 42a is engaged with the key hole 92. In the second embodiment, the door 91 is caught by the door opening/closing unit 242 by suction of the sucker 244. However, the door opening/closing unit 42 of the first embodiment may be provided with the sucker of the second embodiment to hold the door 91 by suction, or the door opening/closing unit 242 of the second embodiment may be configured to hold the door 91 as the key 42a is engaged with the key hole 92 in the same manner as the first embodiment.

The FOUP opening/closing device of the embodiments of the present invention is not limited to the probe apparatus, and may be applied to, e.g., load ports of a semiconductor manufacturing apparatus using gas treatment or heat treatment, or a coater apparatus for coating, e.g., a resist solution to a semiconductor wafer.

While the invention has been shown and described with respect to the embodiments, it will be understood by those skilled in the art that various changes and modification may be made without departing from the scope of the invention as defined in the following claims.

What is claimed is:

1. A Front Opening Unified Pod (FOUP) opening/closing device to open or close a door of an opening of an FOUP, comprising:
   a housing in which a mounting table for mounting the FOUP thereon is disposed;
   an FOUP loading opening formed on a front surface of the housing and configured to be opened or closed by a shutter, wherein the housing receives the FOUP through the FOUP loading opening such that the FOUP can be disposed inside the housing;
   a delivery opening formed on a side surface of the housing, substrates being transferred into and from the FOUP through the delivery opening;
   a door opening/closing unit disposed in the housing at a position of a rear surface of the housing and that opens and closes the door of the FOUP and holds the door stationary at the rear surface of the housing, the rear surface being orthogonal to the side surface;
   a rotator that rotates the mounting table about a vertical axis between a first position and a second position, wherein the opening of the FOUP faces the rear surface at the first position and the opening of the FOUP faces the side surface at the second position;
   a mover that moves the FOUP or the door opening/closing unit in a reciprocating manner, so as to allow the FOUP and the door opening/closing unit to be connected to or separated from each other; and
   a controller programmed to output control signals for moving the FOUP or the door opening/closing unit via operation of the mover so as to mount the door of the FOUP to the door opening/closing unit, separating the door from the FOUP, moving the FOUP or the door opening/closing unit to make the FOUP and the door opening/closing unit separated from each other, and rotating the mounting table to make the FOUP face the delivery opening.

2. The FOUP opening/closing device of claim 1, wherein a rotating center of the mounting table is eccentric from a center of the FOUP toward the FOUP loading opening.

3. The FOUP opening/closing device of claim 1, wherein the FOUP is mounted on the mounting table when positioning the FOUP in front of the delivery opening and the door opening/closing unit.

4. The FOUP opening/closing device of claim 1, wherein the door opening/closing unit is disposed stationary in the housing at the position of the rear surface of the housing, and the mover moves the FOUP in the reciprocating manner.

5. The FOUP opening/closing device of claim 1, wherein the mover moves the door opening/closing unit in the reciprocating manner.

6. The FOUP opening/closing device of claim 1, wherein an entirety of the door opening/closing unit remains stationary throughout opening and closing the door of the FOUP.

7. The FOUP opening/closing device of claim 1, wherein an entirety of the door opening/closing unit does not move in a direction parallel to the vertical axis throughout opening and closing the door of the FOUP.

8. A probe apparatus comprising:
at least one FOUP opening/closing device as recited in claim 1;
a plurality of probe units arranged laterally at the rear surface of the housing, each of the probe units being configured to inspect a substrate by using a probe card; and
a transfer device configured to receive the substrate from the FOUP through the delivery opening and to transfer the substrate into each of the probe units while being moved below the delivery opening.

9. The probe apparatus of claim 8, wherein the at least one FOUP opening/closing device includes two FOUP opening/closing devices arranged to face each other across an arrangement region of the transfer device.

10. The probe apparatus of claim 8, wherein the FOUP is mounted on the mounting table when positioning the FOUP in front of the delivery opening and the door opening/closing unit.

11. The probe apparatus of claim 8, wherein the door opening/closing unit is disposed stationary in the housing at the position of the rear surface of the housing, and the mover moves the FOUP in the reciprocating manner.

12. The probe apparatus of claim 8, wherein the mover moves the door opening/closing unit in the reciprocating manner.

13. A probe apparatus comprising:
at least one FOUP opening/closing device as recited in claim 1;
a plurality of probe units arranged laterally at the rear surface of the housing, each of the probe units being configured to inspect a substrate by using a probe card; and
a transfer device configured to receive the substrate from the FOUP through the delivery opening and to transfer the substrate into each of the probe units while being moved below said at least one FOUP opening/closing device.

14. A probe apparatus comprising:
at least one FOUP opening/closing device as recited in claim 2;
a plurality of probe units arranged laterally at the rear surface of the housing, each of the probe units being configured to inspect a substrate by using a probe card; and
a transfer device configured to receive the substrate from the FOUP through the delivery opening and to transfer the substrate into each of the probe units while being moved below the delivery opening.

15. The probe apparatus of claim 14, wherein the at least one FOUP opening/closing device includes two FOUP opening/closing devices arranged to face each other across an arrangement region of the transfer device.

16. The probe apparatus of claim 14, wherein the FOUP is mounted on the mounting table when positioning the FOUP in front of the delivery opening and the door opening/closing unit.

17. The probe apparatus of claim 14, wherein the door opening/closing unit is disposed stationary in the housing at the position of the rear surface of the housing, and the mover moves the FOUP in the reciprocating manner.

18. The probe apparatus of claim 14, wherein the mover moves the door opening/closing unit in the reciprocating manner.

19. A probe apparatus comprising:
at least one FOUP opening/closing device as recited in claim 2;
a plurality of probe units arranged laterally at the rear surface of the housing, each of the probe units being configured to inspect a substrate by using a probe card; and
a transfer device configured to receive the substrate from the FOUP through the delivery opening and to transfer the substrate into each of the probe units while being moved below said at least one FOUP opening/closing device.

* * * * *